US006133101A

United States Patent [19]

Wu

[11] Patent Number: 6,133,101

[45] **Date of Patent: *Oct. 17, 2000**

[54] LOW MASK COUNT PROCESS TO FABRICATE MASK READ ONLY MEMORY DEVICES

[75] Inventor: Shye-Lin Wu, Hsinchu, Taiwan

[73] Assignee: Texas Instruments - Acer Incorporated, Hsinchu, Taiwan

[ * ] Notice: This patent is subject to a terminal disclaimer.

[21] Appl. No.: 09/057,867

[22] Filed: Apr. 9, 1998

[51] Int. Cl.[7] .................................... H01L 21/8236

[52] U.S. Cl. .................... 438/276; 438/278; 438/305; 438/527; 257/390; 257/392

[58] Field of Search .................... 438/130, 200, 438/276, 278, 302, 305, 525, 527, 264, 307, 201, 216, 217; 365/185.01; 257/327, 278, 776, 336, 369, 392

[56] References Cited

U.S. PATENT DOCUMENTS

| | | | |
|---|---|---|---|
| 5,432,106 | 7/1995 | Hong | 438/257 |
| 5,470,774 | 11/1995 | Kunitgou | 438/278 |
| 5,516,711 | 5/1996 | Wang | 438/217 |
| 5,538,914 | 7/1996 | Chiu et al. | 438/275 |
| 5,744,394 | 4/1998 | Iguchi et al. | 438/276 |
| 5,759,901 | 6/1998 | Loh et al. | 438/305 |
| 5,825,686 | 10/1998 | Schmitt-Landsiedel et al. | 365/185.03 |
| 5,885,873 | 3/1999 | Wu | 438/276 |

*Primary Examiner*—Wael Fahmy
*Assistant Examiner*—William David Coleman
*Attorney, Agent, or Firm*—Harness, Dickey & Pierce, P.L.C.

[57] ABSTRACT

The present invention includes performing a blanket ion implantation to form lightly doped drain regions (LDD) adjacent to gate structures. A second ion implantation is performed with tilted angle to form p channel punchthrough stopping regions. A third ion implantation is used to implant ions into a NMOS device region. Oxide spacers are then formed on gate structures. Next, a forth ion implantation is then carried out to dope ions into the substrate to form source and drain regions in the NMOS region and a NMOS cell region, respectively. Next, a fifth ion implantation is used to dope dopant into a PMOS device region, thereby forming source and drain regions in the PMOS device region. Subsequently, a high temperature thermal anneal is performed to form shallow junction of the devices.

20 Claims, 6 Drawing Sheets

4
6 10
8
10
4
4
6 10
8
10
4
4
6 10
8
10
4
230
220
210

4
6 10
8
10
12
4
4
6 10
8
10
12
4
4
6 10
8
10
12
4
230
220
210

4
22
24
18
12
8
6
18
24
22
12
4
4
22
18
16
220
230
8
6
18
22
16
4
18
10
12
8
6
12
210
20
18
10
4

28
4
230
22
18
12
24
8
6
18
24
12
22
4
4
220
22
18
16
8
6
18
22
16
4
4
26
10
18
12
8
6
18
10
12
26
210
4

LOW MASK COUNT PROCESS TO FABRICATE MASK READ ONLY MEMORY DEVICES

FIELD OF THE INVENTION

The present invention relates to semiconductor devices, specifically to semiconductor memories and more specifically to mask read only memories with low mask count process.

BACKGROUND

The memory devices are driven by the new application and the requirement of the future. The advance in the field of computer and communications will use large quantities of each species of memories. For example, computer interfaces will become to be operated by speech processing or vision processing, and other communication interfaces, all of which require a lot of memories. Memory technology will continue to move in the direction of increased numbers of devices in a wafer.

Typically, mask ROM includes at least two types of devices with difference threshold voltages in a wafer. A type of device is formed in an active area and another type of device with a threshold voltage mask formed in another active area during the process. For example, the first device is a normal device with threshold voltage $V_{t1}$ and another device with a threshold voltage $V_{t2}$, wherein the $V_{t1}$ is different from $V_{t2}$. Therefore, the second device needs an extra mask for ion implantation to obtain a different threshold voltage as provided with the first device. The method involves differentiating the threshold voltages by ion implantation of some of the transistor gates to differentiate the threshold voltage. This method raises the threshold voltage of the n-channel device by doping boron with heavy dose. This method is so called threshold voltage programming. In order to achieve above object, prior art obtains different threshold voltage with process that does not involve additional mask of the prior art for ion implantation. For example, in U.S. Pat. No. 5,506,438, Hsue proposes a method to form devices with different threshold voltage which does not include an extra masking step. There are another two methods for programming which are field oxide programming and through-hole programming. Each of the programming methods can be implemented at different stages of the process. The detailed schematic of a read only memory (ROM) and manufacturing process can be seen in "semiconductor devices" written by Betty Prince, John Wiley, Chapter 10, pp 507–512. The field oxide programming is introduced during the manufacturing process to differentiate the threshold voltage of the devices by using gate oxides with different thickness. The third one is to program when the contacts to the cells are opened by selectively opening the contact holes for each transistor to the drain.

The conventional method to form the mask ROM devices, at lease, one extra process is required to define a coded device, such as implant through a sacrifice oxide or polysilicon. The cycle time for the device coding by implanting through sacrifice oxide is too long, while implanting through the polysilicon, the gate oxide degradation is an issue.

SUMMARY

Gate structures are patterned on a PMOS device region, a NMOS device region and a NMOS cell region, respectively. A blanket ion implantation with p type conductive dopant is carried out to form lightly doped drain regions (LDD) adjacent to the gate structures. A second ion implantation is performed with titled angle to form p channel punchthrough stopping regions. A third ion implantation is used to implant ions into the NMOS device region. Oxide spacers are then formed on the side walls of the gate structures by anisotropically etching back an oxide layer. Next, a forth ion implantation is then carried out to dope ions into the substrate to form source and drain regions in the NMOS region and NMOS cell region, respectively. The NMOS of the coded cell exhibits offset structures that are under the spacers after the step. Thus, the threshold voltage of the NMOS cell region will much higher than that of the normal device in the NMOS device region. Next, a fifth ion implantation is used to dope dopant into the PMOS device region, thereby forming source and drain regions in the PMOS device region. Subsequently, a high temperature thermal anneal is performed to activate the dopant and therefore forming shallow junction of the devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method with low mask count to fabricate NMOS transistors with two different threshold voltages for mask ROM devices. With the processes according to the present invention, difference threshold voltages are obtained without the extra mask for prior art. The detailed description can be seen as follows.

Figure 1:
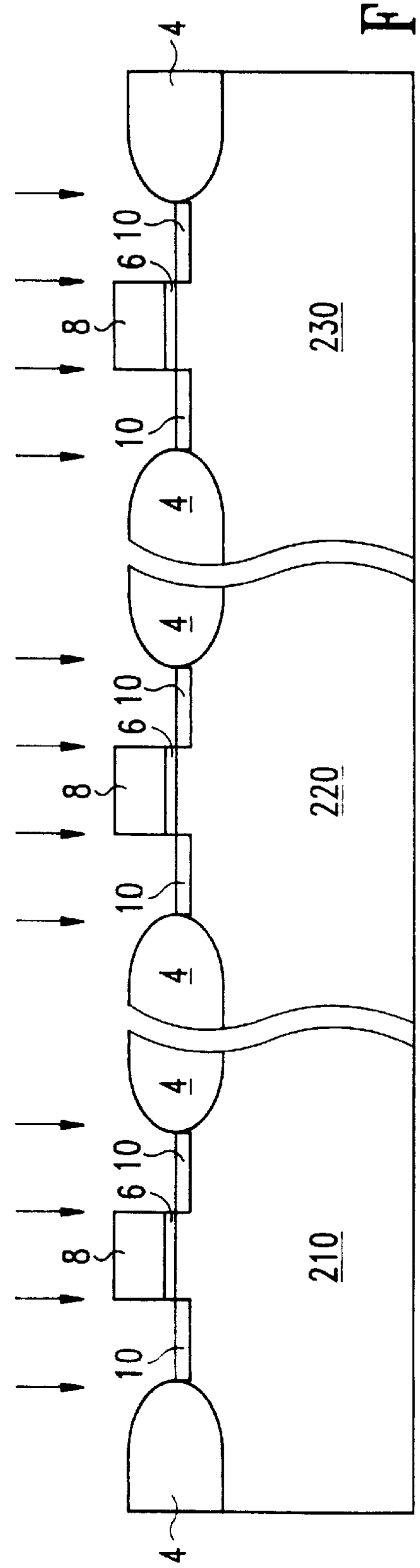
FIG. 1 is a cross sectional view of a semiconductor substrate illustrating the step of performing a first ion implantation to the semiconductor substrate according to the present invention.

Referring to FIG. 1, a single crystal substrate with a <100> crystallographic orientation is used for the preferred embodiment. The substrate is divided into three portions that are a PMOS device region 210, a NMOS device region 220 and a NMOS cell region 230 for coding. In this embodiment, thick field oxide (FOX) regions 4 are created for the purposes of isolation. Typically, the FOX regions 4 are created via a photoresist and dry etching to define a silicon nitride-silicon dioxide composite layer. After the photoresist is removed and wet clean process, thermal oxidation in an oxygen ambient is performed using the composite layer as a hard mask to form the FOX regions 4, to a thickness of about 3000–8000 angstroms. The silicon nitride layer is then typically removed using hot phosphoric acid solution while the silicon dioxide is removed by using diluted HF or BOE solution.

Subsequently, gate structures are defined by means of conventional processes. First, a thin oxide layer 6 is formed on the substrate 2 to act as a gate oxide by using an oxygen-steam ambient, at a temperature between about 800 to 1100 degrees centigrade. Alternatively, the gate oxide 6 may be formed using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms.

After the silicon oxide layer 6 is formed. A polysilicon layer 8 is deposited by chemical vapor deposition on the gate oxide layer 6. Next, the polysilicon layer 8 and the gate oxide layer 6 are patterned to form the gate structures on the aforementioned PMOS device region 210, NMOS device region 220 and NMOS cell region 230, respectively. A blanket ion implantation with p type conductive dopant such as $BF_2$ or boron is carried out to form p type lightly doped drain regions 10 adjacent to the gate structures. The energy and dosage of the implantation are about 5 to 100 KeV, 1E12 to 1E14 atoms/cm$^2$, respectively.

Figure 2:
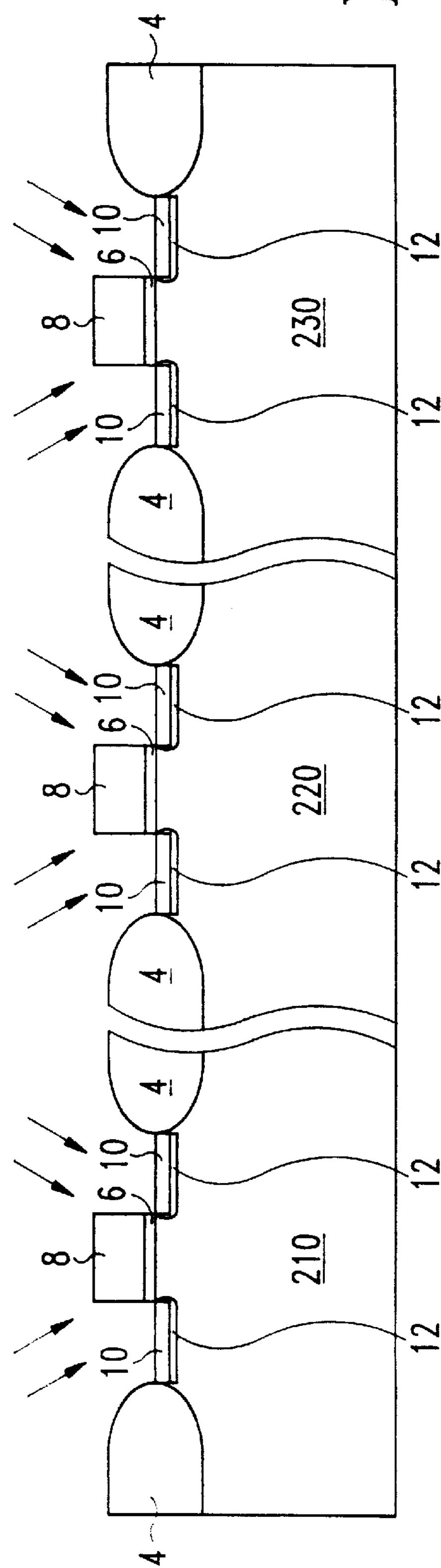
FIG. 2 is a cross sectional view of a semiconductor substrate illustrating the step of performing a second ion implantation to the semiconductor substrate according to the present invention.

Turning to FIG. 2, another ion implantation is performed having large titled angle to form p channel punchthrough stopping regions (or anti-punchthrough regions) 12 surrounding the p type lightly doped drain regions 10. The ion implantation has low dose and the dopant includes phosphorus. The energy of the implantation is about 10 to 150 KeV. The dosage of the implantation is about 5E11 to 5E13 atoms/cm$^2$. Preferably, the tilted angle is about 12 to 60 degrees with respect to the surface of the substrate 2.

Figure 3:
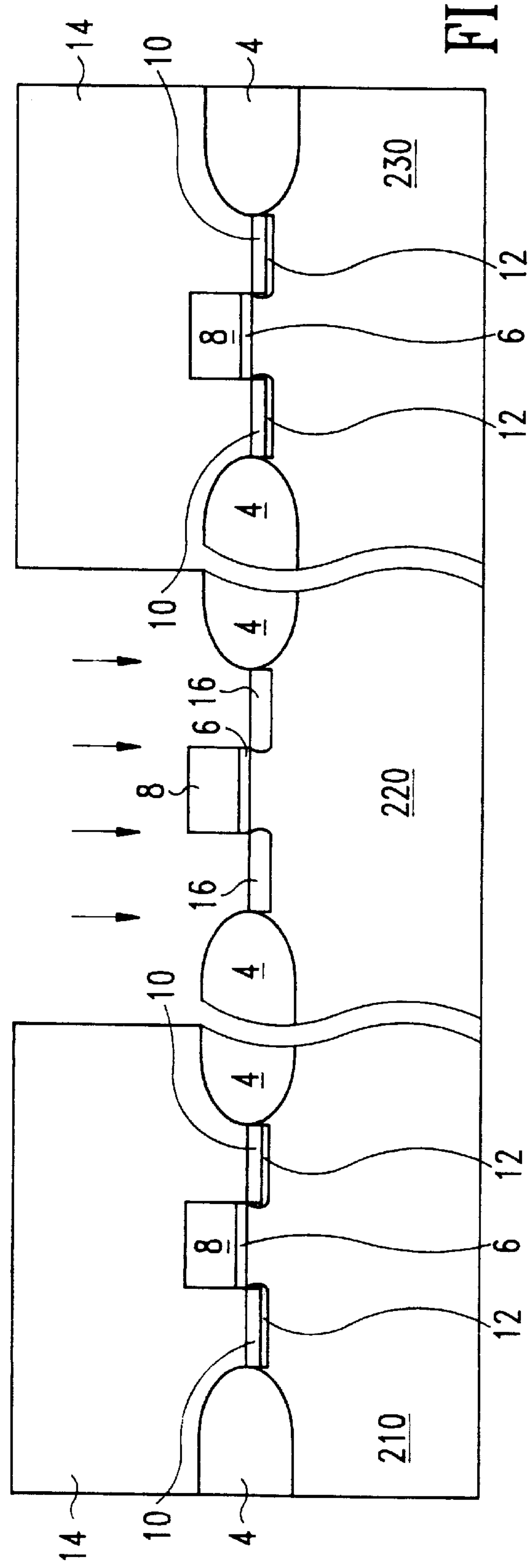
FIG. 3 is a cross sectional view of a semiconductor substrate illustrating the step of performing a third ion implantation to the semiconductor substrate according to the present invention.

Now referring to FIG. 3, a photoresist 14 is patterned over the substrate to expose the NMOS device region 220. A third ion implantation with n conductive type dopant is used to implant ions into the NMOS device region by using the photoresist 14 as a mask, thereby converting the P type LDD region 10 and p channel punchthrough stopping region 12 into n conductive type LDD 16. Preferably, the dopant for the ion implantation is phosphorus and the implantation is performed with low dosage. The energy and dosage of the implantation are about 5 to 120 KeV, 5E12 to 5E14 atoms/cm$^2$, respectively. Next, the photoresist 14 is removed.

Figure 4:
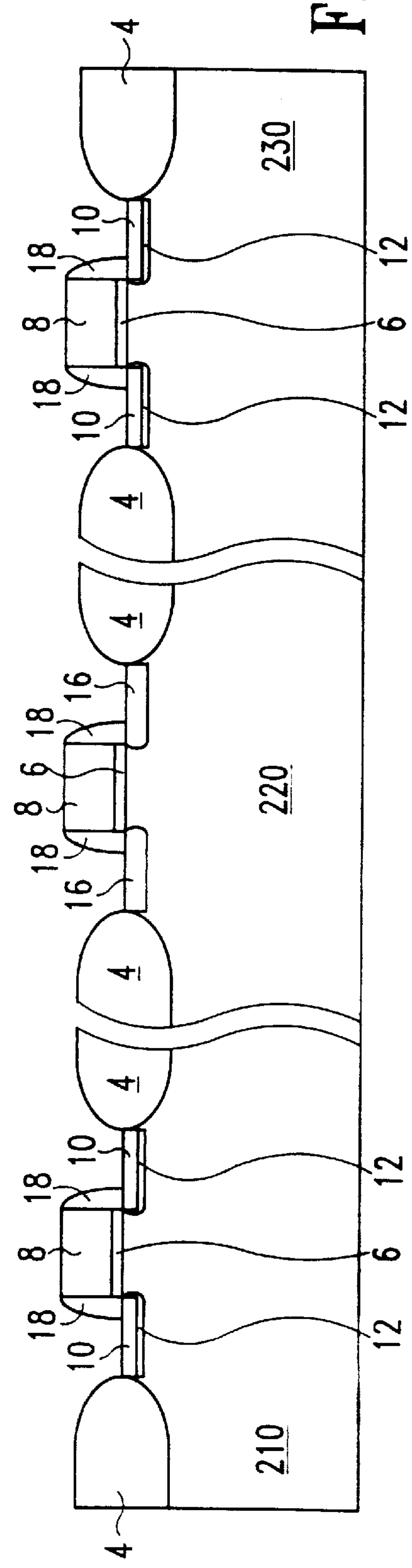
FIG. 4 is a cross sectional view of a semiconductor substrate illustrating the step of forming spacers on the gate structures to according to the present invention.

Referring to FIG. 4, oxide layer is deposited by means of chemical vapor deposition on the gate structures. Side wall spacers 18 are then formed on the side walls of the gate structures by an anisotropically etching back the oxide layer.

Figure 5:
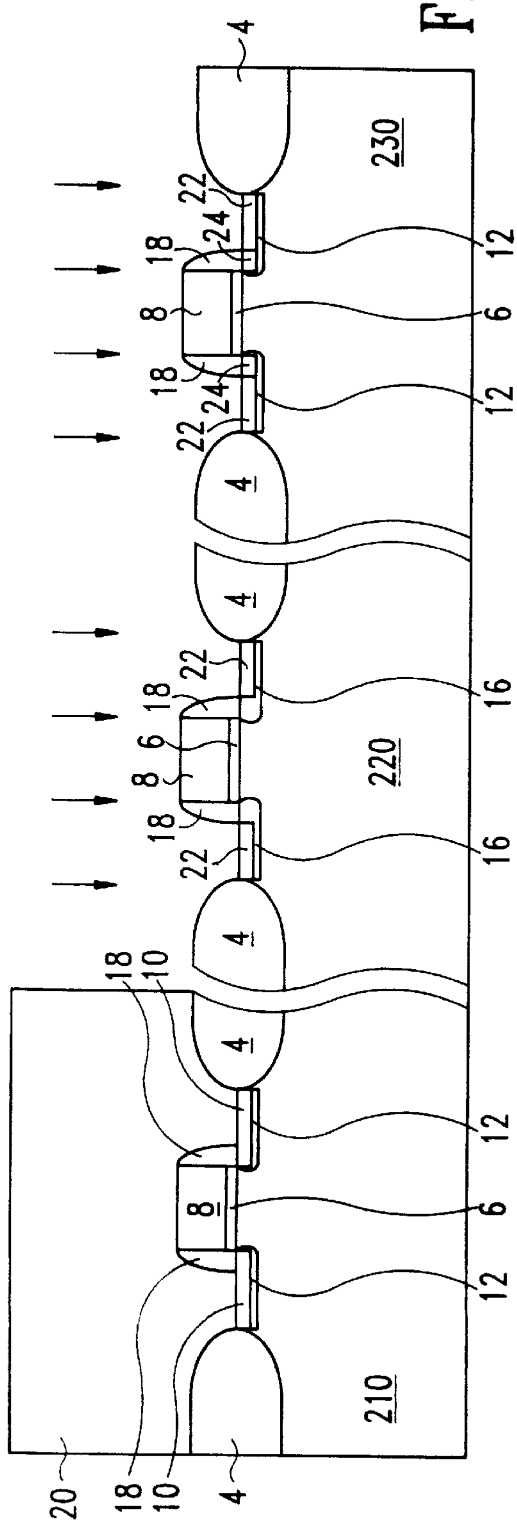
FIG. 5 is a cross sectional view of a semiconductor substrate illustrating the step of performing a forth ion implantation to the semiconductor substrate according to the present invention.

Next, a photoresist 20 is formed on the PMOS device region 210, as shown in FIG. 5. A forth ion implantation is then carried out to dope ions into the substrate by using the photoresist 20 as a mask. In the preferred embodiment, the step is employed with high dose n conductive type ions, such as arsenic or phosphorus. After the procedure, n conductive type source and drain regions 22 are formed adjacent to the gate structure in the NMOS region 220 and NMOS cell region 230, respectively. It has to be note that the NMOS of the coded cell 230 exhibits offset structures 24 having p conductive type ions that are located under the spacers 18. The offset structures 24 exhibit high resistance. Thus, the threshold voltage of the NMOS cell region 230 will much higher than that of the normal device in the NMOS device region 220. The energy and dosage of the forth implantation are about 0.1 to 80 KeV, 5E14 to 5E16 atoms/cm$^2$, respectively. Subsequently, the photoresist is stripped.

Figure 6:
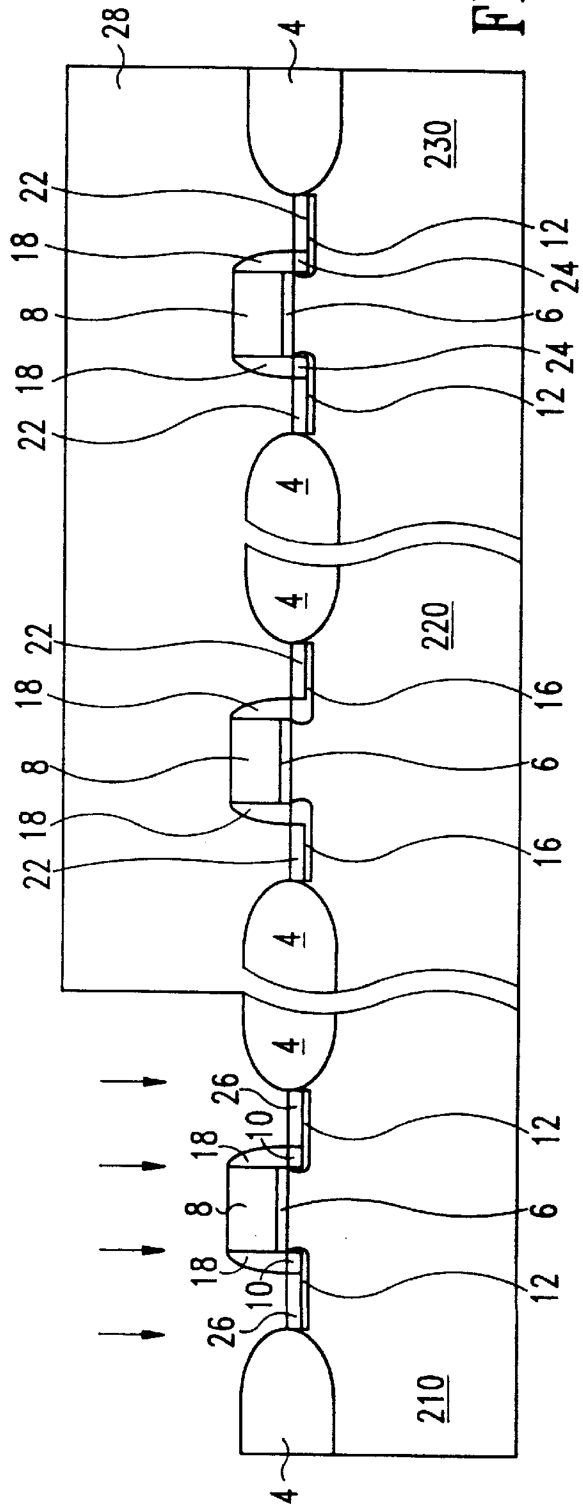
FIG. 6 is a cross sectional view of a semiconductor substrate illustrating the step of performing a fifth ion implantation to the semiconductor substrate according to the present invention.

Next, a fifth ion implantation having high dosage is carried out to dope dopant into the PMOS device region 210, thereby forming source and drain regions 26 in the PMOS device region 210. The cross sectional view of the substrate according to the step is shown in FIG. 6. The energy and dosage of the fifth ion implantation are about 0.1 to 80 KeV, 5E14 to 5E16 atoms/cm$^2$, respectively. Subsequently, the photoresist is stripped. During the process, a photoresist 28 is introduced to cover the NMOS device region 220 and the NMOS cell region 230. In the preferred embodiment, BF2 is used for the fifth ion implantation.

Figure 7:
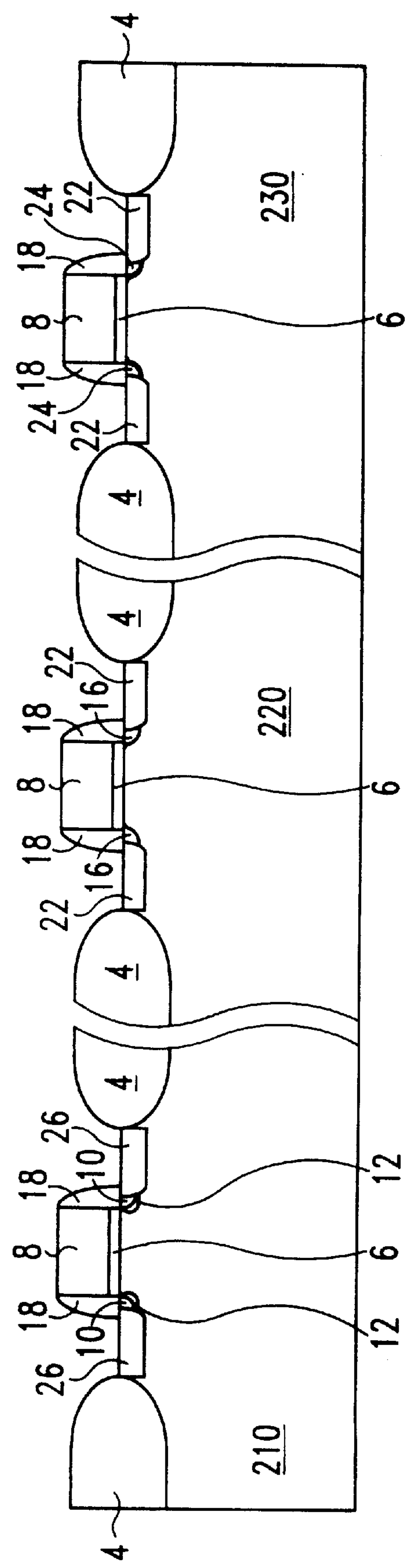
FIG. 7 is a cross sectional view of a semiconductor substrate illustrating the step of performing a thermal anneal to activate dopant according to the present invention.

Turning to FIG. 7, a high temperature thermal anneal is performed in an ambient containing the gas that is selected from the group of $N_2$, $O_2$, and $N_2O$ to activate the dopant and therefore forming shallow junction of the devices. In a case, the temperature for this step can range from 800 to 1100 degrees centigrade.

Figure 8:
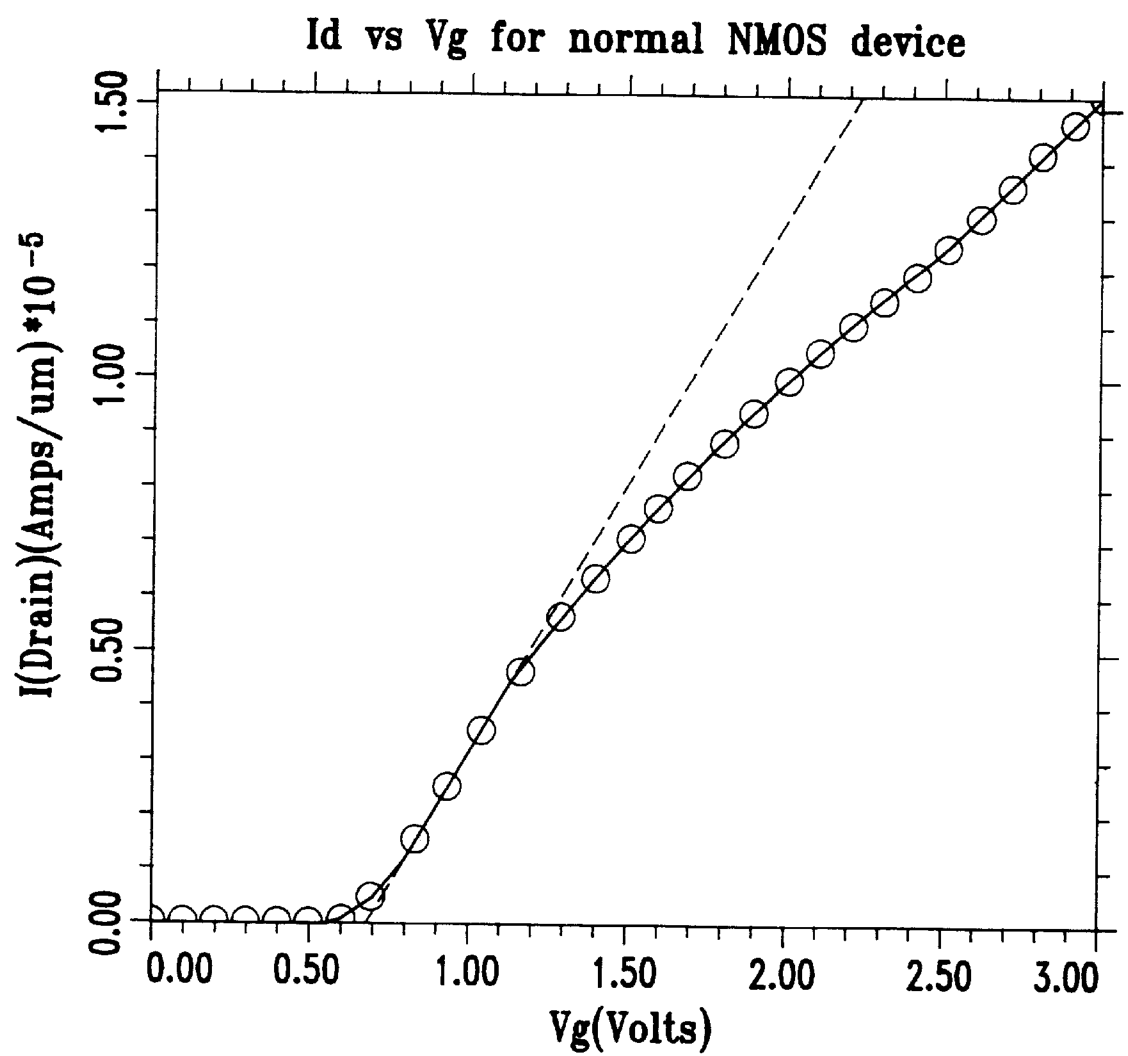
FIG. 8 is a schematic drawing showing the I–V (current to voltage) curve of the normal NMOS device according to the present invention.
Figure 9:
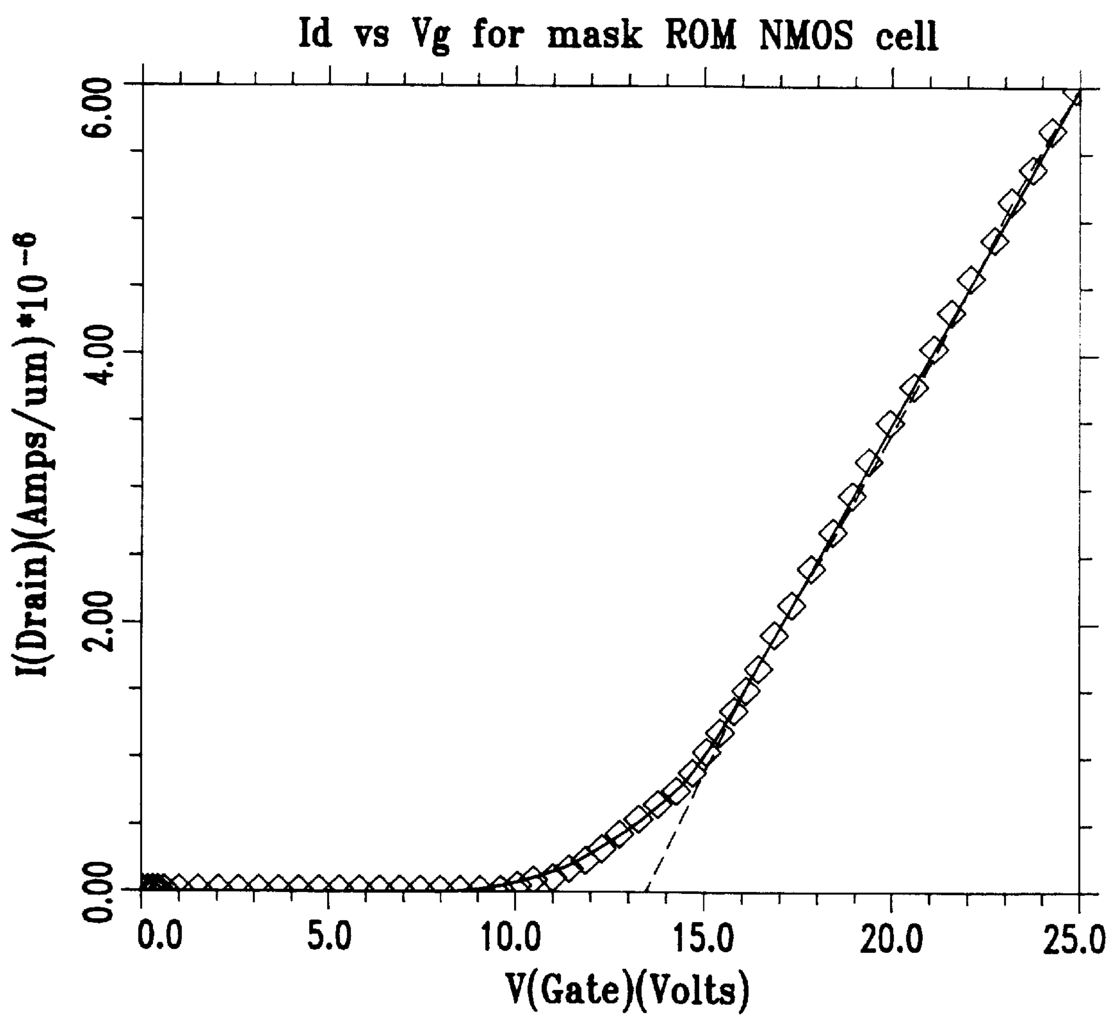
FIG. 9 is a schematic drawing showing the I–V (current to voltage) curve of the mask ROM NMOS cell according to the present invention.

FIG. 8 and FIG. 9 are schematic drawings showing the I–V curve according to the normal NMOS device and mask ROM NMOS cell, respectively. The threshold voltage for the NMOS device is about 0.68 V, whereas the threshold voltage for the mask ROM NMOS cell is about 13.5 V. Therefore, it is easy to form a normally-off mask ROM coded cells. As can be appreciated from the above disclosure, the present invention provides the following advantages: (1) the NMOS devices with difference threshold voltage can be easily made by the present invention without additional mask. (2) the proposed recipe save at least two masks for making CMOS device compared to standard CMOS processes.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a mask ROM (read only memory) device on a semiconductor substrate having a PMOS device region, a NMOS device region and a NMOS cell region for coding, said method comprising:

forming gate structures on said PMOS device region, said NMOS device region and said NMOS cell region, respectively;

performing a first ion implantation to form p conductive type LDD structures adjacent to said gate structure;

performing a second ion implantation with tilted angle to form p channel anti-punchthrough regions surrounding said p conductive type LDD structures;

patterning a first photoresist on said semiconductor substrate to expose said NMOS device region;

performing a third ion implantation by using said first photoresist as a mask to form n conductive type LDD adjacent to said gate structure in said NMOS device region;

removing said first photoresist;

forming spacers on side walls of said gate structure;

patterning a second photoresist on said semiconductor substrate to cover said PMOS device region;

performing a forth ion implantation by using said second photoresist as a mask to form n conductive type source and drain in said NMOS device region and in said NMOS cell region;

removing said second photoresist;

patterning a third photoresist on said semiconductor substrate to expose said PMOS device region;

performing a fifth ion implantation by using said third photoresist as a mask to form p conductive type source and drain in said PMOS device region;

removing said third photoresist; and performing a thermal anneal to activate the dopant in said semiconductor substrate.

2. The method of claim 1, wherein the dopant of said first ion implantation comprises $BF_2$.

3. The method of claim 1, wherein the energy of said first ion implantation is about 5 to 100 KeV.

4. The method of claim 1, wherein the dosage of said first ion implantation is about 1E12 to 1E14 atoms/$cm^2$.

5. The method of claim 1, wherein the dopant of said second ion implantation comprises phosphorus.

6. The method of claim 1, wherein the energy of said second ion implantation is about 10 to 150 KeV.

7. The method of claim 1, wherein the dosage of said second ion implantation is about 5E11 to 5E13 atoms/$cm^2$.

8. The method of claim 1, wherein said tilted angle is about 10–60 degrees with respect to the surface of said semiconductor substrate.

9. The method of claim 1, wherein the dopant of said third ion implantation comprises phosphorus.

10. The method of claim 1, wherein the energy of said third ion implantation is about 5 to 120 KeV.

11. The method of claim 1, wherein the dosage of said third ion implantation is about 5E12 to 5E14 atoms/$cm^2$.

12. The method of claim 1, wherein the dopant of said forth ion implantation comprises arsenic.

13. The method of claim 1, wherein the energy of said forth ion implantation is about 0.1 to 80 KeV.

14. The method of claim 1, wherein the dosage of said forth ion implantation is about 5E14 to 5E16 atoms/$cm^2$.

15. The method of claim 1, wherein the dopant of said fifth ion implantation comprises $BF_2$.

16. The method of claim 1, wherein the energy of said fifth ion implantation is about 0.1 to 0.8 KeV.

17. The method of claim 1, wherein the dosage of said fifth ion implantation is about 5E14 to 5E16 atoms/$cm^2$.

18. The method of claim 1, wherein said thermal anneal is performed at a temperature about 800 to 1100 degrees centigrade.

19. The method of claim 1, wherein said thermal anneal is performed in an ambient containing a gas that is selected from a group consisting of $N_2$, $O_2$ and $N_2O$.

20. The method of claim 1, wherein said spacers include oxide spacers.

* * * * *